US009679810B1

(12) United States Patent
Nag et al.

(10) Patent No.: US 9,679,810 B1
(45) Date of Patent: Jun. 13, 2017

(54) INTEGRATED CIRCUIT HAVING IMPROVED ELECTROMIGRATION PERFORMANCE AND METHOD OF FORMING SAME

(71) Applicant: GLOBALFOUNDRIES INC., Grand Cayman (KY)

(72) Inventors: Joyeeta Nag, Clifton Park, NY (US); Shishir K. Ray, Clifton Park, NY (US); Andrew H. Simon, Fishkill, NY (US); Oleg Gluschenkov, Tannersville, NY (US); Siddarth A. Krishnan, Newark, CA (US); Michael P. Chudzik, Mountain View, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/041,203

(22) Filed: Feb. 11, 2016

(51) Int. Cl.
*H01L 23/48* (2006.01)
*H01L 21/768* (2006.01)
*H01L 23/522* (2006.01)

(52) U.S. Cl.
CPC .... *H01L 21/76883* (2013.01); *H01L 21/7684* (2013.01); *H01L 21/7685* (2013.01); *H01L 21/76802* (2013.01); *H01L 21/76843* (2013.01); *H01L 21/76849* (2013.01); *H01L 21/76886* (2013.01); *H01L 23/522* (2013.01)

(58) Field of Classification Search
CPC ......... H01L 21/76843; H01L 21/76879; H01L 21/76883; H01L 21/76886; H01L 21/76802; H01L 21/7684; H01L 21/7685; H01L 21/76849; H01L 23/522
See application file for complete search history.

(56) References Cited

U.S. PATENT DOCUMENTS

| 6,181,012 B1 | 1/2001 | Edelstein et al. |
| 6,399,496 B1 | 6/2002 | Edelstein et al. |
| 2005/0006770 A1* | 1/2005 | Sukharev .......... H01L 21/76846 257/758 |
| 2014/0035935 A1* | 2/2014 | Shenoy .................. H01L 23/15 345/501 |

OTHER PUBLICATIONS

Nogami et al., "High Reliability 32 nm Cu/ULK BEOL Based on PVD CuMn Seed, and its Extendibility," Presented at IEDM, 2010. 4 pages.

* cited by examiner

*Primary Examiner* — (Vikki) Hoa B Trinh
(74) *Attorney, Agent, or Firm* — Yuanmin Cai; Hoffman Warnick LLC

(57) ABSTRACT

An aspect of the disclosure is directed to a method of forming an interconnect for use in an integrated circuit. The method comprises: forming an opening in a dielectric layer on a substrate; filling the opening with a metal such that an overburden outside of the opening is created; subjecting the metal to a microwave energy dose such that atoms from the overburden migrate to within the opening; and planarizing the metal to a top surface of the opening to remove the overburden, thereby forming the interconnect.

15 Claims, 3 Drawing Sheets

INTEGRATED CIRCUIT HAVING IMPROVED ELECTROMIGRATION PERFORMANCE AND METHOD OF FORMING SAME

BACKGROUND

Technical Field

The present disclosure relates to integrated circuits, and more particularly, to integrated circuits having an improved electromigration performance and a metal with an increased grain size, and a method of forming the same.

Related Art

Integrated circuit interconnects, and particularly, high performance conductors are used for most types of advanced integrated circuits and are typically fabricated having thick metal wires such as copper (Cu) or aluminum (Al). Traditionally, the metal wires are formed using electrolytic plating processes in conjunction with photoresist masking and stripping, and removing a seed layer later on. In damascene processes, metal interconnect lines are delineated and isolated in dielectrics by means of chemical mechanical polishing (CMP). A dual damascene process is a similar process in which metal interconnect lines and vias (i.e., conductor-filled channels) are defined independently in photolithography and etch but metallized simultaneously.

Conventionally, the damascene process includes forming an opening, e.g., a trench, in a dielectric layer on a substrate. The opening may be coated with a liner and/or seed layer. Subsequently, a metal, e.g., copper, is plated such that the metal substantially fills the opening. The metal is plated such that it includes a large number of grains which are much smaller than the wiring dimensions, e.g., linewidth. This large number of grains results in the interconnect having a larger resistance than a single-grained structure of the same dimensions. To increase grain size and reduce the resistance, the unannealed wiring structures may be held at room temperature for a period of the order of several hours to a few days in order to allow room-temperature recrystallization to occur. To reduce the overall time of the damascene process, a gentle furnace anneal may be performed to increase the grain size of the metal. To avoid exposing the interconnect to too much heat, the furnace anneal is typically performed at approximately 100° C. for about an hour. Conventional annealing at temperatures higher than about 100° C. results in faster grain growth and, consequently, larger grains but leads to forming voids within the entire interconnect structure. As the grain size of the metal increases, the resistance of the interconnect decreases resulting in lower-resistance wiring and a higher-performance integrated circuit. Additionally, the larger metal grains result in a more durable and reliable interconnect over the life of the integrated circuit. However, any metal void formed within the interconnect structure drastically degrades durability and reliability of interconnects.

Subsequently, the metal may be planarized to complete the formation of the interconnect, and in some cases, a dielectric cap layer may be formed over the interconnect. After formation of the interconnect, the interconnect can be exposed to subsequent anneal processes. Typically, the subsequent anneal process will be a batch furnace anneal at temperatures of approximately 300° C. to approximately 400° C., performed near the end of the wafer build. Additional anneals that could be performed after capping include pulsed laser anneals, which can be calibrated to achieved recrystallization, depending on the dielectric layers, metal pattern factor, and other specifics for a particular product.

Proper annealing of the metal is critical to suppress a reliability phenomenon known as electromigration. As current is passed through the metal conductor, the metal atoms may become physically displaced in the metal due to an effect known as electromigration. Electromigration refers to the transport of material caused by the movement of metal atoms in the conductor due to the momentum transfer between drift-current electrons and the metal atoms. At normal operating temperatures, electromigration occurs over an extended time (i.e., greater than the warranty period of the circuit) when the momentum of flowing electrons is transferred to a metal atom in the conductor lattice. However, at elevated temperatures, such as approximately 300° C. to approximately 400° C., such as are used during reliability testing, electromigration can be observed to occur in an accelerated time span of minutes or hours. This transfer of momentum causes the metal atoms to move from their original positions. As metal atoms spread to the exterior of the metal due to electromigration, the resulting tensile stresses in the metal cause voids to be created within the metal, resulting in interconnect and/or chip failures.

SUMMARY

A first aspect of the disclosure is directed to a method of forming an interconnect for use in an integrated circuit. The method comprises: forming an opening in a dielectric layer on a substrate; filling the opening with a metal such that an overburden outside of the opening is created; subjecting the metal to a microwave energy dose such that atoms from the overburden migrate to within the opening; and planarizing the metal to a top surface of the opening to remove the overburden, thereby forming the interconnect.

A second aspect of the disclosure is directed to a method of forming an interconnect for use in an integrated circuit. The method comprises: forming an opening in a dielectric layer on a substrate; forming a liner layer to substantially coat the opening; forming a seed layer to substantially coat the liner layer within the opening; filling the opening with a metal such that an overburden outside of the opening is created; subjecting the metal to a microwave energy dose such that atoms from the overburden migrate to within the opening; planarizing the metal to a top surface of the opening to remove the overburden; and forming a dielectric cap layer over the metal, thereby forming the interconnect.

A third aspect of the disclosure is directed to an interconnect in an integrated circuit. The interconnect comprises: an opening in a dielectric layer on a substrate; and a metal layer substantially filling the opening; wherein a concentration of vacancies within the metal layer is below an equilibrium concentration of vacancies within the metal layer.

BRIEF DESCRIPTION OF THE DRAWINGS

These and other features of this disclosure will be more readily understood from the following detailed description of the various aspects of the invention taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the invention. In the drawings, like numbering represents like elements between the drawings.

DETAILED DESCRIPTION

The present disclosure relates to integrated circuits, and more particularly, to integrated circuits having a metal with a reduced grain size and a method of forming the same.

Aspects of the present disclosure provide an integrated circuit having a reduced electromigration effect. The electromigration phenomenon can be used to enhance microwave annealing of the conducting wires if the anneal is performed with an overburden intact, in which said overburden provides a source of metal atoms to replace voids and/or vacancies created by a microwave annealing current, and the combined thickness of the metal conductor and overburden is less than or comparable to the microwave skin depth of the conductor metal. Specifically, the present disclosure provides for a microwave treatment process as an alternative to and/or in addition to the conventional furnace anneal. The microwave annealing results in a reduction in the grain size of the metal within the interconnect which reduces the overall resistance of the integrated circuit and increases the overall efficiency of the integrated circuit. Further, the microwave treatment process is performed prior to planarization of the metal and uses the electromigration effect to prevent voids within the metal.

Figure 1:
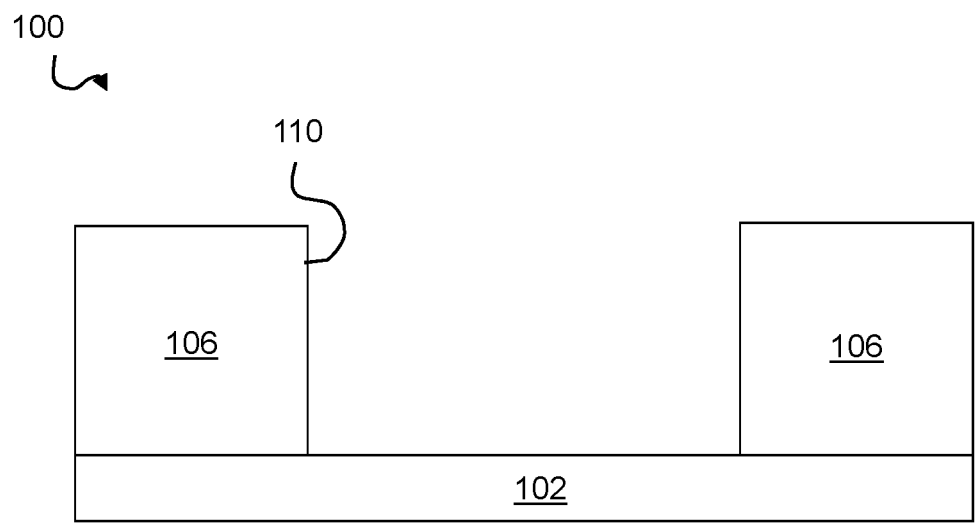
FIGS. 1-6 show steps for forming an interconnect for use in an integrated circuit according to aspects of the method as described herein.
Figure 3:
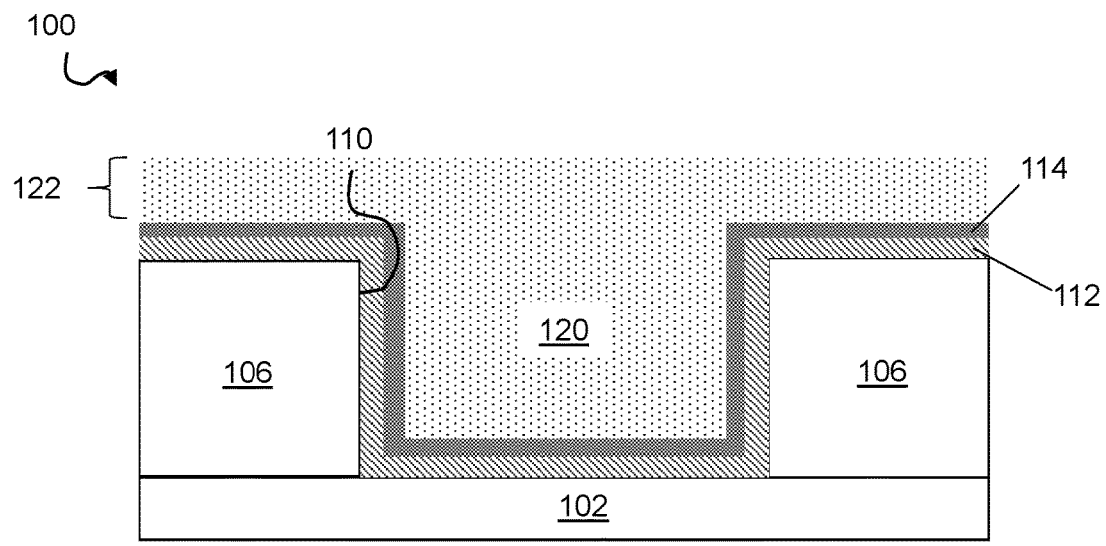
Figure 4:
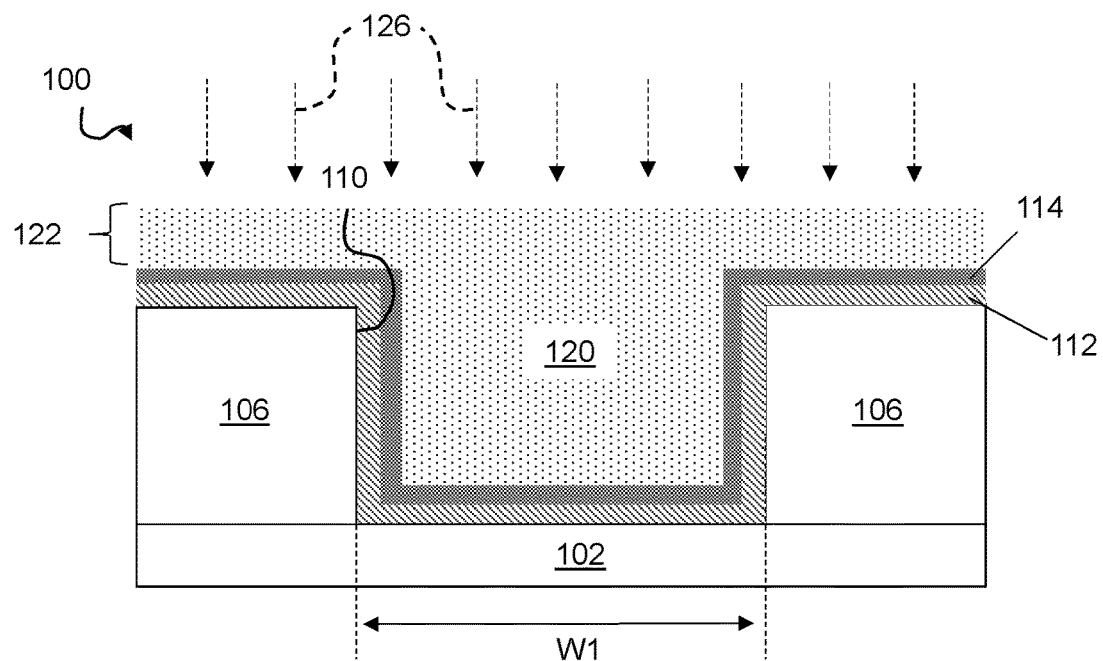
Figure 5:
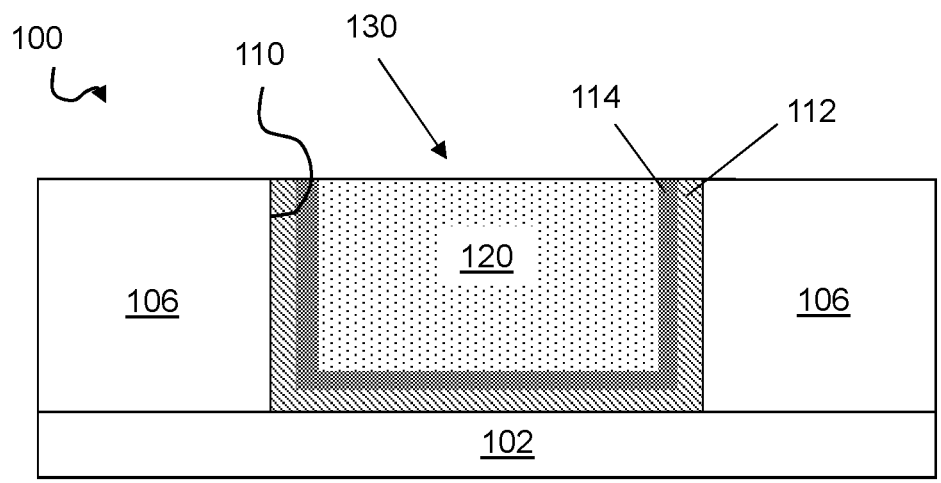
Figure 6:
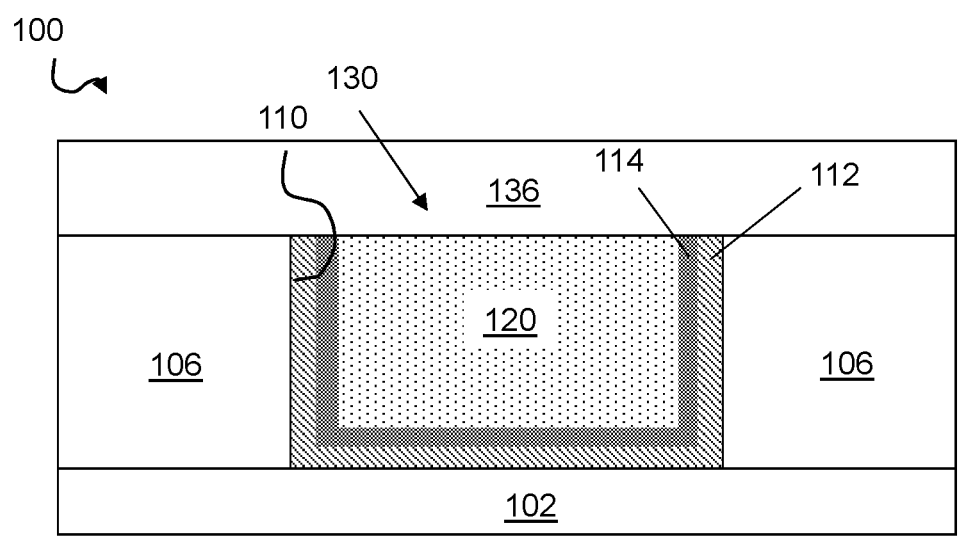

FIGS. 1-6 show steps for forming an interconnect for use in an integrated circuit according to aspects of the method as described herein, with FIGS. 5-6 showing the resulting interconnect 130. Referring first to FIG. 1, an integrated circuit (IC) structure 100 is shown. IC structure 100 may be formed by forming a dielectric layer 106 over a substrate 102. Substrate 102 may be a semiconductor substrate that may comprise but is not limited to silicon, germanium, silicon germanium, silicon carbide, and those consisting essentially of one or more Group III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Substrate 102 may also comprise Group II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

Dielectric layer 106 may be approximately 50 nanometers (nm) to approximately 500 nm thick or more. As used herein "approximately" is intended to include values, for example, within 10% of the stated values. Dielectric layer 106 may be a material such as but not limited to silicon oxide ($SiO_2$), silicon nitride ($Si_3N_4$), hafnium oxide ($HfO_2$), hafnium silicon oxide (HfSiO), hafnium silicon oxynitride (HfSiON), zirconium oxide ($ZrO_2$), zirconium silicon oxide (ZrSiO), zirconium silicon oxynitride (ZrSiON), aluminum oxide ($Al_2O_3$), titanium oxide ($Ti_2O_5$), tantalum oxide ($Ta_2O_5$), hydrogen silsesquioxane polymer (HSQ), methyl silsesquioxane polymer (MSQ), SiLK™ (polyphenylene oligomer) manufactured by Dow Chemical, Midland, Mich.; Black Diamond™ [$SiO_x(CH_3)_y$] manufactured by Applied Materials, Santa Clara, Calif. or other similar silicon (Si), carbon (C), oxygen (O), and hydrogen (H) containing carbon doped oxide (SiCOH) dielectrics; fluorinated tetraethylorthosilicate (FTEOS), and fluorinated silicon glass (FSG). In an embodiment, dielectric layer 106 may comprise fluorinated silicon glass (FSG) or an organic material, for example, a polyimide.

Dielectric layer 106 may be formed on substrate 102 via conventional deposition techniques. As used herein, "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. It will be understood that when an element as a layer, region or substrate is referred as being "on" or "over" another element, it can be directly on the other element or intervening elements may be present. It will also be understood that when an element is referred to as being "connected" or "coupled" to another element, it can be directly connected or couple to the other element or intervening elements may be present.

Still referring to FIG. 1, an opening 110 may be formed into dielectric layer 106. This may be accomplished by applying a layer of photoresist on dielectric layer 106, patterning the photoresist, and performing an etch process, e.g., a reactive ion etch (RIE), to define opening 110 in dielectric layer 106. While opening 110 is shown as exposing substrate 102, it is to be understood that in other embodiments, opening 110 may be formed without exposing substrate 102, such that opening 110 does not extend completely through dielectric layer 106.

Figure 2:
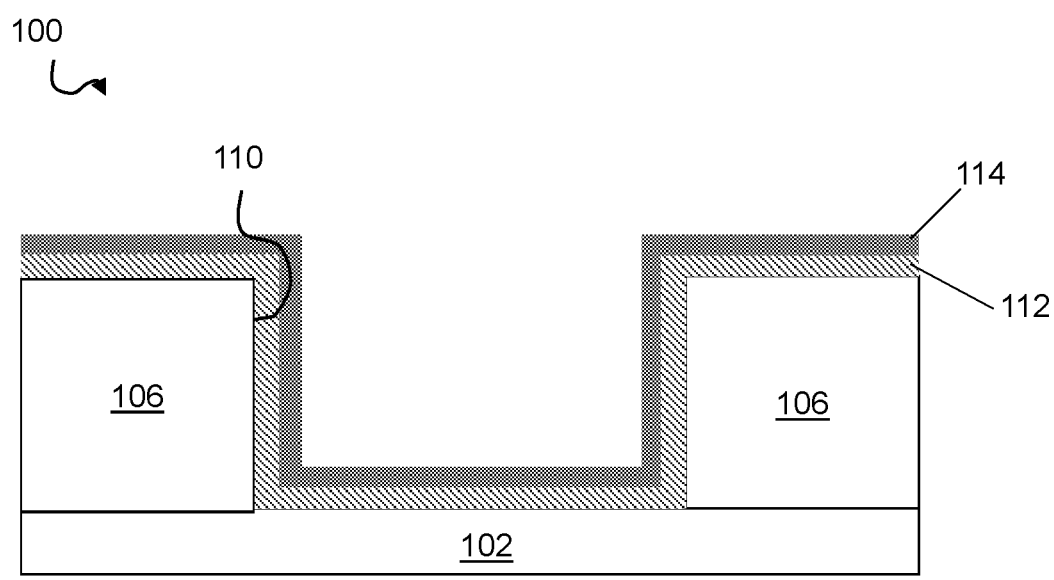

Referring now to FIG. 2, a liner layer 112 and a seed layer 114 may be formed, e.g., deposited, within opening 110 such that opening 110 is conformally coated with liner layer 112 and seed layer 114. Liner layer 112 may include at least one of: tantalum (Ta), tantalum nitride (TaN), tantalum-aluminum nitride (TaAlN), tantalum silicide ($TaSi_2$), titanium (Ti), titanium nitride (TiN), titanium-silicon nitride (TiSiN), tungsten (W), manganese (Mn), cobalt (Co), or ruthenium (Ru). Liner layer 112 may be approximately 10 Å to approximately 100 Å thick. Seed layer 114, for example, a copper seed layer, may be disposed on liner layer 112 and may be approximately 50 Å to approximately 1000 Å thick. Seed layer 114 may include optional dopants as known in the art, such as for example, manganese (Mn) or aluminum (Al). In an embodiment, liner layer 112 may be in contact with dielectric layer 106 and substrate 102 within opening 110, while seed layer 114 overlays liner layer 112. That is, liner layer 112 may be formed such that liner layer 112 substantially coats opening 110, and seed layer 114 may be formed such that seed layer 114 substantially coats liner layer 112. As such herein, "substantially" refers to largely, for the most part, entirely specified or any slight deviation which provides the same technical benefits of the disclosure. In another embodiment, liner layer 112 may be separated from substrate 102 via dielectric layer 106 within opening 110.

As shown in FIG. 3, a metal 120 may be formed over seed layer 114 to substantially fill opening 110. Metal 120 may be formed by an electrolytic metal plating process to fill opening 110. The process may be performed with a current density of approximately 10 microAmps/mm$^2$ (electric current per square area) to approximately 100 microAmps/mm$^2$ using a plating solution including at least one of: a copper sulfate solution, a sulfuric acid solution, and a solution including chlorine ions. Metal 120 is vertically grown from the exposed areas of seed layer 114 toward and past the top of opening 110 such that an overburden 122 of metal 120 is formed outside opening 110. In some embodiments, metal 120, or more particularly overburden 122, may extend past the top of opening 110 by approximately 100 nm to approximately 500 nm. Metal 120 may include, but is not limited to, for example, copper (Cu), silver (Ag), cobalt (Co), or gold (Au).

After metal 120 is formed in opening 110, integrated circuit 100 may undergo a microwave treatment process as shown in FIG. 4. During the microwave treatment process, metal 120 is subjected to a microwave energy dose 126. As known in the art, microwaves may have a frequency of approximately 300 megahertz (MHz) to approximately 300 gigahertz (GHz). Microwaves used herein may include a frequency within that range, or more particularly of approximately 2.5 GHz to approximately 62 GHz. Microwave energy dose 126 may performed at approximately 0.01 kW/cm$^2$ to about 1.0 kW/cm$^2$ (while the incident or generated power will be much higher from about 0.1 kW/cm$^2$ to about 100 kW/cm$^2$) for approximately 0.5 hours to approximately 10 hours. More specifically, microwave energy dose 126 may be supplied for approximately 6 hours to approximately 8 hours. Microwave energy dose 126 may be supplied to increase the temperature of substrate 102 to a temperature of approximately 90° C. to approximately 400° C. Microwave energy dose 126 causes recrystallization of metal 120 to form approximately 1 grain of metal 120 to approximately 5 grains of metal 120 across a width W1 of opening 110 while the surrounding materials are unaffected. That is, in some embodiments, the average grain width may be approximately equal to width W1 of opening 110. The average grain size after the recrystallization may be several linewidths in length, i.e., it may be approximately 30 nm to approximately 200 nm or more. In some embodiments, upon the completion of the annealing step, metal 120 which fills metal trench 110 of width W1 may have grains of at least 3*W1 and as much as 10*W1 when measured along the direction of current flow, enabling lower resistance and higher reliability than existing annealing methods. In some embodiments, these larger grains may have a <111> crystal orientation. In a case where seed layer 114 is doped, such a crystal orientation may result in segregation of seed layer 114 dopants.

As discussed herein, conventional damascene processes provide for a gentle furnace anneal after the metal plating. The furnace anneal may be performed at a temperature of approximately 100° C. for approximately 1 hour. Embodiments of the present disclosure provide for a microwave treatment process as an alternative to and/or in addition to the conventional furnace anneal. The conventional furnace anneal heats the metal without passing a current through the metal. The microwave treatment process described herein results in the heating of metal 120 by passing a current through metal 120. As microwave energy dose 126 is supplied to metal 120, the current that is passed through overburden 122 results in the migration of atoms from overburden 122 to within opening 110. That is, voids may be created in overburden 122, but are not created in within opening 110. The present disclosure utilizes a microwave treatment process to concentrate metal atoms of metal 120 within opening 110 which prevents the creation of voids and increases the grain size of metal 120 within opening 110. Therefore, a relationship between the relative thickness of overburden 122 and frequency of the microwave treatment can be used to optimize the grain size of metal 120 within opening 110. Such a relationship may be represented by the following formula:

$$\delta = \sqrt{\frac{2\rho}{(2\pi f)(\mu_0 \mu_r)}}$$

where δ represents the skin depth in meters; $\mu_r$ represents the relative permeability of the medium, i.e, metal 120; $\mu_0$ represents the permittivity of free space; ρ represents the resistivity of the medium; and f represents the frequency of the current. Skin depth refers to how far, or how deep, electro-magnetic waves will penetrate into a conductor, and thus how far below the surface of the conductor electrical current will flow.

Within metal 120, the supplied microwave energy induces a substantial eddy current density with peak density of approximately 1.0 mA/μm$^2$ to approximately 10 mA/μm$^2$ near the surface. The eddy current density quickly subsides at distances of greater than the skin depth. Raised substrate temperature along with this high current density is sufficient to initiate and sustain an electromigration phenomena near the surface of metal 120. The electromigration phenomena creates vacancies or voids within the area of high current density or, equivalently, within the upper portion of the skin depth layer (overburden 122 of metal 120) by migrating metallic atoms away from high current density zone and toward opening 110. At any given temperature including room temperature, crystalline materials have a certain concentration of vacancies when an individual atom is removed from its lattice site. Such equilibrium concentration of vacancies depends on the vacancy energy (an energy per atom needed to create a vacancy), the ambient temperature, and the density of atoms in the crystalline lattice. Advantageously, the thickness of overburden 122 is selected to substantially attenuate the eddy current density preventing electromigration within opening 110 while providing a flux of metallic atoms to heal any vacancies and voids within opening 110. In one example, a thickness of overburden 122 may be approximately one-half to approximately three times the microwave skin depth of a given material used for metal 120. The flux of migrating metallic atoms may reduce the concentration of metal atom vacancies within opening 110 to below its equilibrium value at the anneal temperature, e.g., approximately 400° C. For copper interconnects, such equilibrium copper vacancy concentration at an anneal temperature of 400° C. is about 1e15 cm$^{-3}$. The significance of reducing metallic vacancies and voids within interconnects is an improved interconnect reliability.

Referring now to FIG. 5, a planarization may be performed such that any material, i.e., liner layer 112, seed layer 114, and overburden 122 (FIGS. 3-4), outside opening 110 may be removed. That is, metal 120 may be planarized to a top surface of opening 110. Planarization refers to various processes that make a surface more planar (that is, more flat and/or smooth). Chemical-mechanical-polishing (CMP) is one conventional planarization process which planarizes surfaces with a combination of chemical reactions and mechanical forces. CMP uses slurry including abrasive and corrosive chemical components along with a polishing pad and retaining ring, typically of a greater diameter than the wafer. The pad and wafer are pressed together by a dynamic polishing head and held in place by a plastic retaining ring. The dynamic polishing head is rotated with different axes of rotation (that is, not concentric). This removes material and tends to even out any "topography," making the wafer flat and planar.

Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; and/or (x) sacrificial etch-back.

The planarization step results in an interconnect 130 formed in an opening 110 in a dielectric layer 106 on a substrate 102. Interconnect 130 may include metal layer 120 over seed layer 114 and liner layer 112 in an opening 110 in dielectric layer 106 on substrate 102. That is, interconnect 130 may include liner layer 112 substantially coating opening 110 and seed layer 114 substantially coating liner layer 112. Metal 120 may substantially fill opening 110. As discussed herein, metal 120 may be several linewidths in length, i.e., it may have an average grain size of approximately 30 nm to approximately 200 nm or more. Further, in some embodiments, metal 120 may have an average grain width of approximately equal to width W1 (FIG. 4) of opening 110. In other embodiments, metal 120 which fills metal trench 110 of width W1, may have grains of at least 3*W1 and as much as 10*W1 when measured along the direction of current flow, enabling lower resistance and higher reliability than existing annealing methods.

As shown in FIG. 6, a dielectric cap layer 136 may be formed, i.e., deposited, over interconnect 130. Dielectric cap layer 136 may include any of the materials discussed herein with respect to dielectric layer 106.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method of forming an interconnect for use in an integrated circuit, the method comprising:
   forming an opening in a dielectric layer on a substrate;
   filling the opening with a metal such that an overburden outside of the opening is created;
   subjecting the metal to a microwave energy dose such that atoms from the overburden migrate to within the opening; and
   planarizing the metal to a top surface of the opening to remove the overburden, thereby forming the interconnect.

2. The method of claim 1, wherein the subjecting of the metal to the microwave energy dose includes subjecting the metal to the microwave energy dose for approximately 0.5 hours to approximately 10 hours.

3. The method of claim 1, wherein the subjecting of the metal to the microwave energy dose recrystallizes the metal to form metal grains having a width of at approximately three times a width of opening to approximately ten times the width of the opening when measured along the direction of current flow.

4. The method of claim 1, further comprising:
   performing a laser anneal after the filling of the opening with the metal and before the subjecting of the metal to the microwave dose.

5. The method of claim 1, wherein the subjecting the metal to the microwave energy dose recrystallizes the metal such that an average grain length of the metal is approximately 30 nanometers or more.

6. The method of claim 1, wherein the overburden includes a thickness of approximately one-half to approximately three times a skin depth of microwave radiation in the metal.

7. The method of claim 1, wherein the metal includes at least one of: copper, silver, cobalt and gold.

8. The method of claim 1, further comprising:
   forming a liner layer to substantially coat the opening after the forming of the opening; and
   forming a seed layer to substantially coat the liner layer within the opening prior to the filling of the opening with the metal.

9. The method of claim 8, wherein the liner layer includes at least one of: tantalum, tantalum nitride, tantalum-aluminum nitride, tantalum silicide, titanium, titanium nitride, titanium-silicon nitride, tungsten, manganese, cobalt, and ruthenium, and
   wherein the seed layer includes a copper seed layer.

10. A method of forming an interconnect for use in an integrated circuit, the method comprising:
    forming an opening in a dielectric layer on a substrate;
    forming a liner layer to substantially coat the opening;
    forming a seed layer to substantially coat the liner layer within the opening;
    filling the opening with a metal such that an overburden outside of the opening is created;
    subjecting the metal to a microwave energy dose such that atoms from the overburden migrate to within the opening;
    planarizing the metal to a top surface of the opening to remove the overburden; and
    forming a dielectric cap layer over the metal, thereby forming the interconnect.

11. The method of claim 10, wherein the subjecting of the metal to the microwave energy dose includes subjecting the metal to the microwave energy dose for approximately 0.5 hours to approximately 10 hours.

12. The method of claim 10, wherein the subjecting of the metal to the microwave energy dose recrystallizes the metal to form grains having an average grain length of approximately 30 nanometers (nm) or more.

13. The method of claim 10, wherein further comprising:
performing a laser anneal after the filling of the opening with the metal and before the subjecting of the metal to the microwave dose.

14. The method of claim 10, wherein the subjecting the metal to the microwave energy dose recrystallizes the metal such that an average grain length of the metal is approximately 30 nanometers or more.

15. The method of claim 10, wherein the metal includes at least one of: copper, silver, cobalt, and gold.

* * * * *